(12) United States Patent
Kaneko

(10) Patent No.: US 10,475,372 B2
(45) Date of Patent: Nov. 12, 2019

(54) LIGHT-EMITTING UNIT, DISPLAY DEVICE, AND MULTI-DISPLAY DEVICE

(71) Applicant: Mitsubishi Electric Corporation, Tokyo (JP)

(72) Inventor: Shota Kaneko, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 15/747,523

(22) PCT Filed: Dec. 28, 2016

(86) PCT No.: PCT/JP2016/089035
§ 371 (c)(1),
(2) Date: Jan. 25, 2018

(87) PCT Pub. No.: WO2018/122997
PCT Pub. Date: Jul. 5, 2018

(65) Prior Publication Data
US 2018/0374412 A1   Dec. 27, 2018

(51) Int. Cl.
*G09G 3/32* (2016.01)
*G09F 9/00* (2006.01)
(Continued)

(52) U.S. Cl.
CPC ............... *G09G 3/32* (2013.01); *G09F 9/00* (2013.01); *G09F 9/30* (2013.01); *G09F 9/33* (2013.01);
(Continued)

(58) Field of Classification Search
CPC ... G09G 2320/0233; G09G 2320/0242; G09G 2320/041; G09G 3/32; H01L 25/0753;
(Continued)

(56) References Cited

U.S. PATENT DOCUMENTS 8,289,477 B2 * 10/2012 Kobayashi ........ G02F 1/133603
349/64
9,366,424 B2 * 6/2016 Takase ............. G02F 1/133603
(Continued)

FOREIGN PATENT DOCUMENTS

JP        11-85104 A      3/1999
JP        5468914 B2      4/2014

OTHER PUBLICATIONS

International Search Report for PCT/JP2016/089035 dated Mar. 21, 2017.
(Continued)

*Primary Examiner* — Charles V Hicks
(74) *Attorney, Agent, or Firm* — Birch, Stewart, Kolasch & Birch, LLP

(57) ABSTRACT

The object is to provide a technology capable of enhancing an image quality of a light-emitting unit. The light-emitting unit includes a substrate having a first surface and a second surface that is on an opposite side to the first surface, a plurality of light-emitting elements arranged in the first surface, and a plurality of light-emitting-element driving portions each for driving at least two light-emitting elements included in the plurality of light-emitting elements. The plurality of light-emitting-element driving portions are arranged in the second surface in a plurality of aligned states that are different from one another, or arranged in the second surface in an unaligned state.

6 Claims, 17 Drawing Sheets

(51) Int. Cl.
*G09F 9/30* (2006.01)
*G09F 9/33* (2006.01)
*G09F 9/40* (2006.01)
*H01L 51/50* (2006.01)
*H01L 27/32* (2006.01)
*H01L 33/00* (2010.01)
*H01L 25/075* (2006.01)

(52) U.S. Cl.
CPC ............ *G09F 9/40* (2013.01); *H01L 25/0753* (2013.01); *H01L 27/32* (2013.01); *H01L 33/00* (2013.01); *H01L 51/50* (2013.01); *G09G 2320/0233* (2013.01); *G09G 2320/0242* (2013.01); *G09G 2320/041* (2013.01)

(58) Field of Classification Search
CPC ......... H01L 33/00; H01L 51/50; H01L 27/32; G09F 9/00; G09F 9/33; G09F 9/40; G09F 9/30
See application file for complete search history.

(56) References Cited

U.S. PATENT DOCUMENTS

| | | |
|---|---|---|
| 2008/0245949 A1 | 10/2008 | Morimoto et al. |
| 2009/0051293 A1 | 2/2009 | Houdek et al. |
| 2010/0194271 A1 | 8/2010 | Tomiyoshi |
| 2011/0109655 A1 | 5/2011 | Takeda |
| 2012/0032969 A1* | 2/2012 | Sugiyama ............ G06F 3/1431 345/589 |
| 2016/0231624 A1 | 8/2016 | Hillman et al. |

OTHER PUBLICATIONS

Extended European Search Report dated Apr. 5, 2019 in corresponding European Application No. 16925516.3.
Chen et al., "Study on the Staggered Array of an LED System for Improved Thermal Behavior," Applied Optics, vol. 54, No. 22, Aug. 1, 2015 (Jul. 27, 2015), pp. 6752-6757, XP055542430.

* cited by examiner

F I G. 8
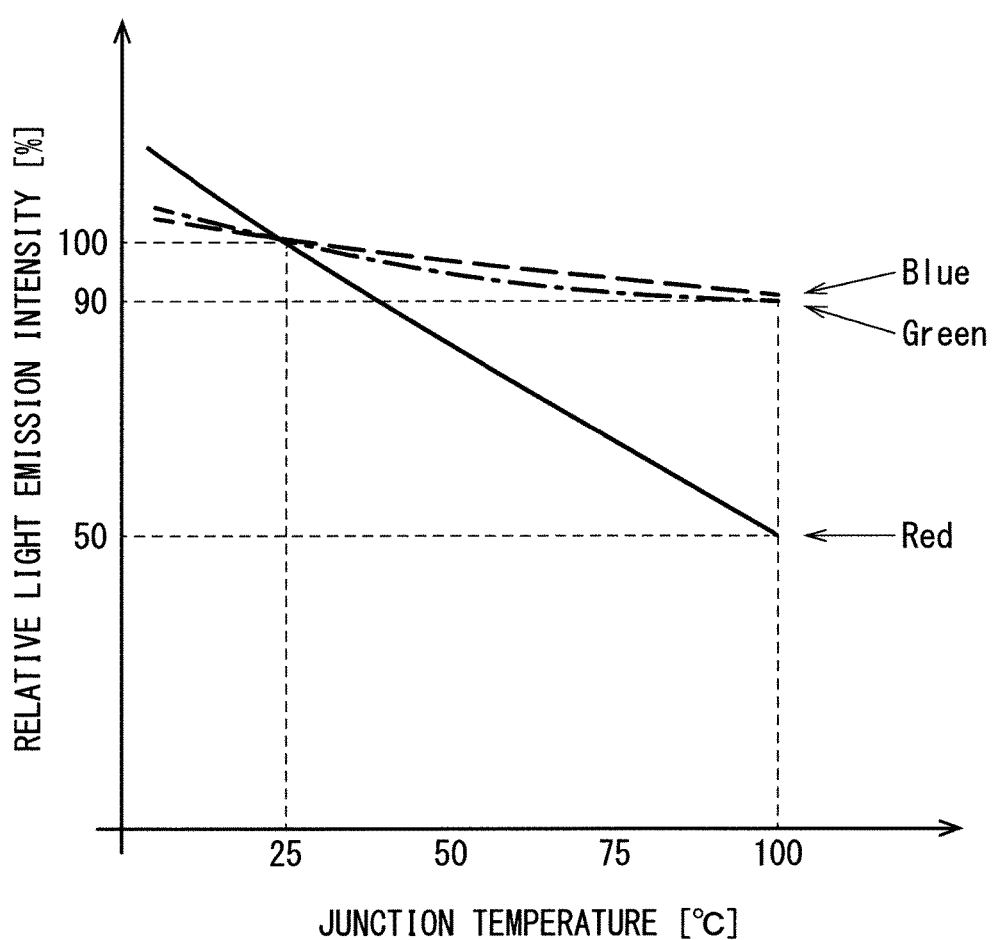

F I G. 2 0
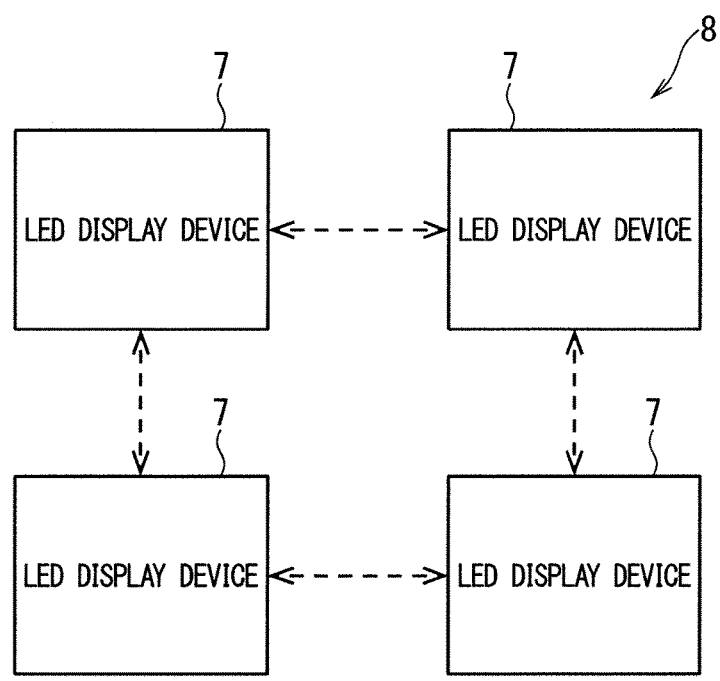

LIGHT-EMITTING UNIT, DISPLAY DEVICE, AND MULTI-DISPLAY DEVICE

TECHNICAL FIELD

The present invention relates to a light-emitting unit, and a display device and a multi-display device including the light-emitting unit.

BACKGROUND ART

There is known a display device in which light emitting diodes (hereinafter referred to as "LEDs") are arranged in a matrix pattern to thereby display an image (hereinafter referred to as an "LED display device"). In this LED display device, there is a problem in that, in a case where luminance and chromaticity of the LEDs being pixels are non-uniform, those are visually recognized adversely as luminance unevenness and color unevenness of an image.

As the causes of the luminance unevenness and color unevenness, there are given luminance dispersion and color dispersion generated due to dispersion in manufacture of the LEDs themselves, and temperature unevenness inside a substrate in which the LEDs are mounted in a matrix pattern (hereinafter referred to as an "LED mounting substrate"). In view of the above, a technology is proposed to suppress the luminance unevenness and color unevenness for each of the causes of the luminance unevenness and color unevenness.

As a technology for correcting the luminance dispersion and color dispersion generated due to the dispersion of manufacture of the LEDs themselves to thereby make the luminance and chromaticity uniform, a technology of Patent Document 1 is proposed, for example. In this technology, an image is taken with a camera, and a correction coefficient of each pixel for making luminance uniform is calculated based on luminance characteristics obtained from the results of the image taking, and the luminance is corrected using the correction coefficient, thereby being capable of making luminance uniform.

As a technology for suppressing the luminance unevenness and color unevenness generated due to the temperature unevenness inside the LED mounting substrate, a technology of Patent Document 2 is proposed, for example. In this technology, a cooling fan for cooling the LED mounting substrate is controlled based on luminance information obtained through image taking with a camera, thereby being capable of controlling suppression of the temperature unevenness, and further, the luminance unevenness and the like.

PRIOR ART DOCUMENTS

Patent Documents

Patent Document 1: Japanese Patent Application Laid-Open No. 11-85104 (1999)
Patent Document 2: Japanese Patent No. 5468914

SUMMARY

Problem to be Solved by the Invention

In technologies of Patent Documents 1 and 2 of measuring luminance and chromaticity using a camera or the like and then correcting each pixel based on the measurement results, the measurement and the calculation of the correction coefficient are performed for each of three primary colors of light being red, green, and blue (hereinafter red being referred to as "R," green "G," and blue "B") in general. Specifically, a screen displaying a red image in an entire surface thereof is taken with a camera or the like to thereby calculate a correction coefficient for R, and similar calculations thereto are also performed for G and B. However, a quantity of heat generation at the time of displaying a mixed color of R, G, and B (white, for example) in the entire screen is larger than a quantity of heat generation at the time of displaying only a single color out of R, G, and B in the entire screen. For this reason, there is a problem in incapability of properly correcting the luminance unevenness and color unevenness due to temperature unevenness generated at the time of display of a mixed color even with use of the correction coefficient calculated at the time of displaying each of the colors.

Further, in the technology of performing cooling control based on luminance information, a sensor for sensing luminance and a large number of cooling fans are needed. For this reason, there is a problem in not only requiring a comparatively high cost but also complicating specifications in control and the like.

Further, in recent years, a proposal has been made to form the light-emitting unit at a low cost by using light-emitting-element driving integrated circuits (ICs) that are integrated. However, the quantity of heat generation of the light-emitting-element driving ICs has been increased, and thus luminance unevenness and color unevenness that are caused by temperature unevenness due to the heat generation of the light-emitting-element driving ICs are becoming to be obvious.

Therefore, the present invention is made in view of the problems as described above, and has an object to provide a technology capable of enhancing an image quality of a light-emitting unit.

Means to Solve the Problem

A light-emitting unit according to the present invention includes a substrate having a first surface and a second surface that is on an opposite side to the first surface, a plurality of light-emitting elements arranged in the first surface, and a plurality of light-emitting-element driving portions each for driving at least two light-emitting elements included in the plurality of light-emitting elements. The plurality of light-emitting-element driving portions are arranged in the second surface in an arrayed state including a first aligned state and a second aligned state in which the plurality of light-emitting-element driving portions are arrayed alternately in a row direction and positions of the plurality of light-emitting-element driving portions in a column direction are different from one another, a part of the plurality of light-emitting-element driving portions are arranged in the second surface in the arrayed state, or the plurality of light-emitting-element driving portions are arranged in the second surface in an arrayed state in which the plurality of light-emitting-element driving portions are moved to a vicinity of each of the positions of the arrayed state.

Effects of the Invention

According to the present invention, the plurality of light-emitting-element driving portions are arranged in the second surface in a plurality of aligned states that are different from one another, or arranged in the second surface in an unaligned state. According to such a configuration, it is possible to enhance an image quality of the light-emitting unit.

The object, features, modes, and advantages of the present invention become more obvious with the following detailed description and the attached drawings.

BRIEF DESCRIPTION OF DRAWINGS

FIG. 8 is a view for illustrating temperature dependency of luminance of R, G, and B.

FIG. 20 is a block diagram for illustrating the configuration of the multi-display device according to the second embodiment.

DESCRIPTION OF EMBODIMENTS

First Embodiment

Figure 1:
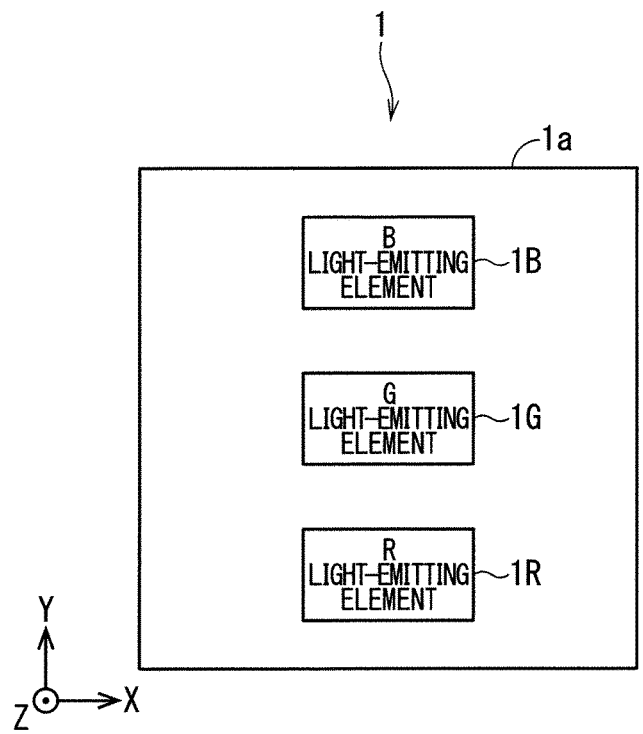
FIG. 1 is a front view for illustrating a configuration of an LED of a light-emitting unit according to a first embodiment.
Figure 2:
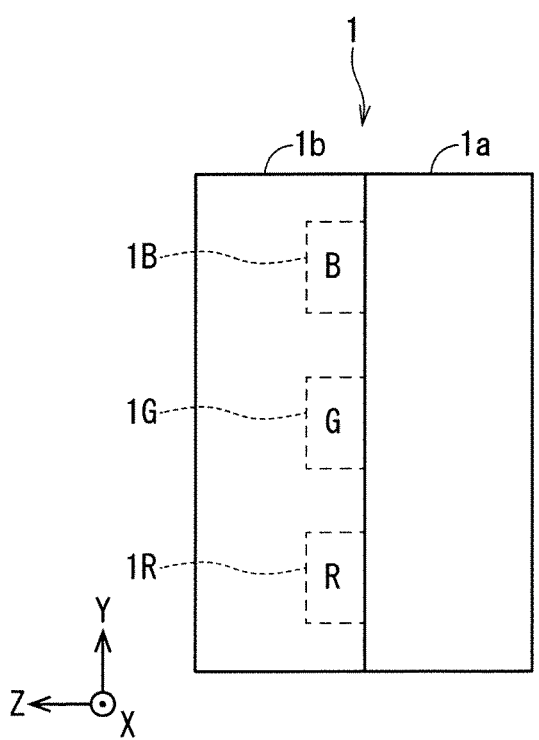
FIG. 2 is a side view for illustrating the configuration of the LED of the light-emitting unit according to the first embodiment.

FIG. 1 and FIG. 2 are a front view and a side view for schematically illustrating an LED 1 that forms each of pixels of a light-emitting unit according to a first embodiment of the present invention. The LED 1 is a light-emitting element of a surface mount device (SMD) type, and is a light-emitting element of a type called 3-in-1 in which LEDs 1R, 1G, and 1B of R, G, and B are assembled inside one package. In the LED 1 of FIG. 1 and FIG. 2, the LEDs 1R, 1G, and 1B are arranged on one substrate 1a, and a sealing material 1b covers the LEDs 1R, 1G, and 1B. A product having a profile of less than 1 mm square exists as the light-emitting element of the above-mentioned type, and a plurality of light-emitting elements are mounted on an LED mounting substrate under a state in which intervals between the plurality of light-emitting elements are narrowed, thereby being capable of forming a high-resolution light-emitting unit, and further, LED display device.

In this first embodiment, there is illustrated a configuration in which a light-emitting element of the SMD type and the 3-in-1 type as the LED 1 is used as each of the plurality of light-emitting elements, but the configuration is not to be limited thereto. Effects to be described below can also be obtained to a certain extent in a configuration in which an LED of a shell type or an LED of an SMD type and a monochromatic type is used as each of the plurality of light-emitting elements, for example. Note that, larger effects are obtained as the light-emitting elements are mounted with higher density, and hence the configuration of this first embodiment is preferable.

Figure 3:
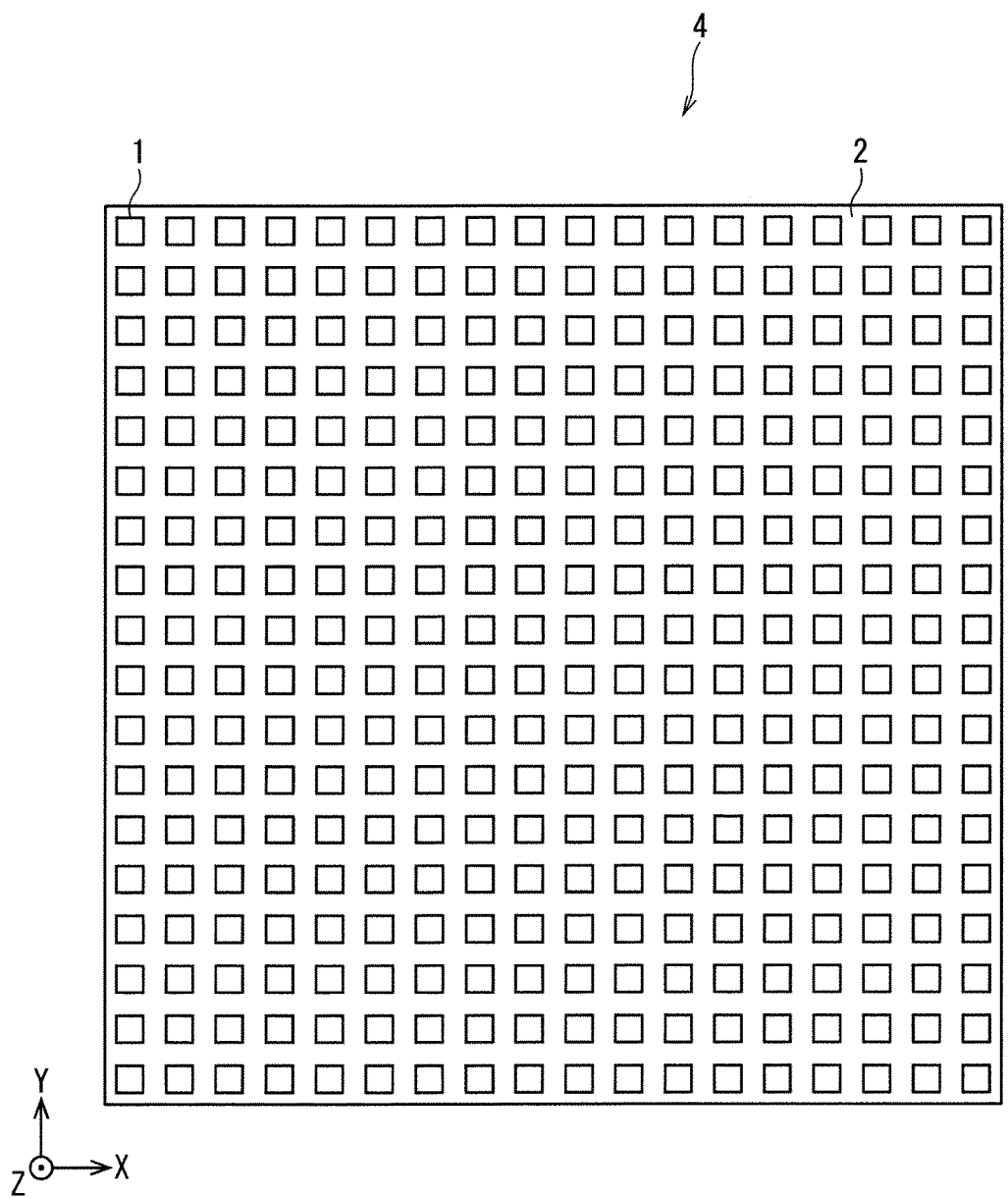
FIG. 3 is a front view for illustrating a configuration of an LED mounting substrate of the light-emitting unit according to the first embodiment.

FIG. 3 is a front view for illustrating a configuration of an LED mounting substrate 4 of the light-emitting unit according to this first embodiment. The LED mounting substrate 4 of FIG. 3 includes a plurality of the LEDs 1, a substrate 2, and a plurality of light-emitting-element driving ICs 3 being a plurality of light-emitting-element driving portions to be described later.

The substrate 2 has a first surface and a second surface that is on an opposite side to the first surface. Hereinafter, the first surface is referred to as a "front surface," and the second surface is referred to as a "back surface."

As illustrated in FIG. 3, the plurality of LEDs 1 are mounted on the front surface of the substrate 2 in a matrix pattern, specifically, mounted in an X direction being a row direction and a Y direction being a column direction with equal intervals. With this, each LED 1 functions as each pixel in an image.

In the configuration of FIG. 3, a total of three-hundred twenty-four LEDs 1 are mounted as an example, eighteen being mounted in the X direction of the substrate 2 and eighteen in the Y direction. In the following description, in a case of specifying a position of one of the LEDs 1 arranged in a matrix pattern, the LED 1 at an a-th position in the X direction and a b-th position in the Y direction is represented as an LEDa•b with reference to the bottom left in FIG. 3. For example, in FIG. 3, the LED 1 at the bottom left is represented as an LED1•1, and the LED 1 at the top right is represented as an LED18•18. On the other hand, the general term for each LED 1 is represented as the LED 1 as is done previously.

On the back surface of the substrate 2, electrical components for performing lighting drive control on each LED 1 are mounted. In actuality, a plurality of kinds of electrical components are used in order to perform lighting drive control. In this first embodiment, however, focusing on the light-emitting-element driving ICs 3 that are electrical components having a comparatively large quantity of heat generation, description is made supposing that the plurality of light-emitting-element driving ICs 3 are arranged on the back surface of the substrate 2.

Each of the plurality of light-emitting-element driving ICs 3 drives the plurality of LEDs 1. For example, light-emitting-element driving ICs 3 perform lighting drive control of switching ON and OFF of each LED in a time-division manner with a pulse width modulation (PWM) method as the above-mentioned drive under a state in which a common voltage is supplied to each LED, thereby performing gradation control of the LEDs.

Each light-emitting-element driving IC 3 is capable of performing multi-channel control, thereby being capable of controlling the lighting drive of two or more LEDs 1 simultaneously. For example, in a case where one light-emitting-element driving IC 3 is capable of controlling an n number of (n being a multiple of 3 and being 6 or more) channels, the light-emitting-element driving IC 3 is capable of performing the lighting drive on n/3 number of LEDs 1 simultaneously because three channels of the LEDs 1R, 1G, and 1B are required for one LED 1. In addition, in a case where each light-emitting-element driving IC 3 is configured to perform line scan control, the lighting drive control can be performed on a large number of the LEDs 1 with one light-emitting-element driving IC 3.

Figure 4:
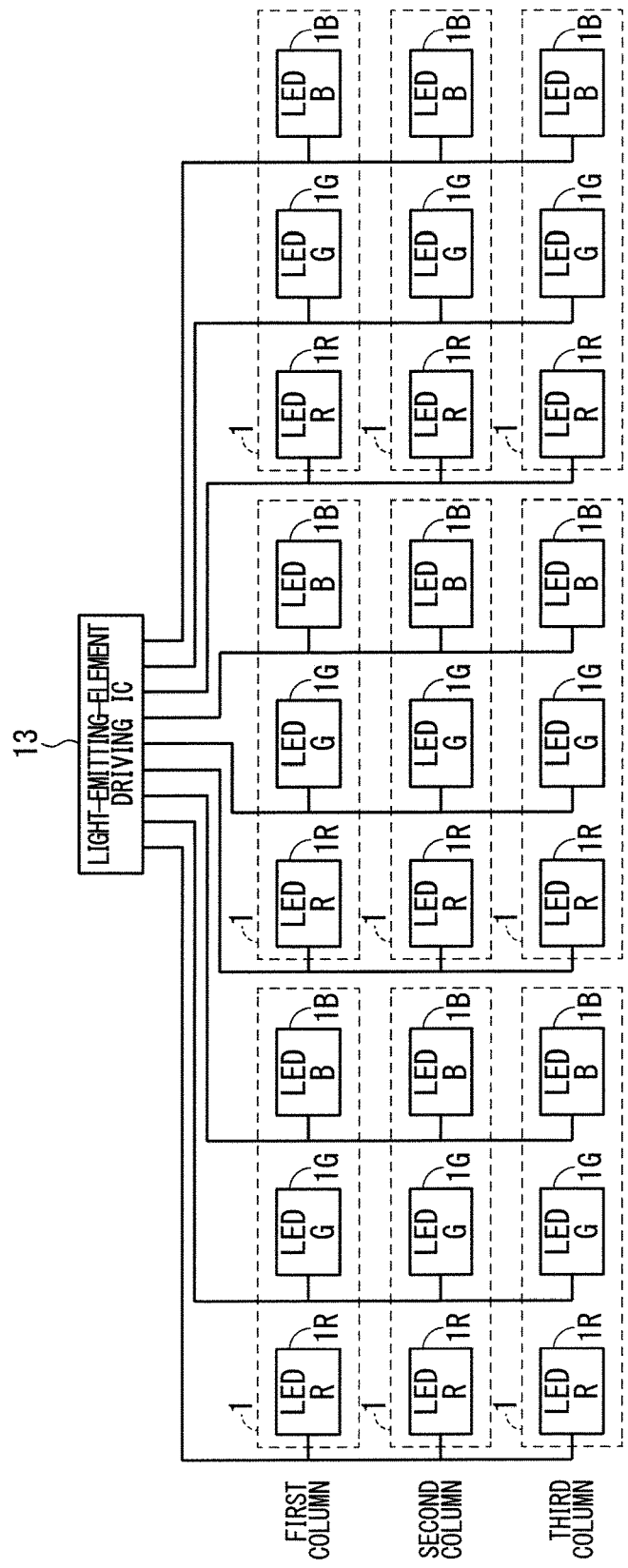
FIG. 4 is a block diagram for illustrating multi-channel control and line scan control.

A configuration of a related light-emitting unit being a light-emitting unit that is related to this first embodiment is herein described using FIG. 4. Note that, the related light-emitting unit and the light-emitting unit according to this first embodiment are substantially the same except that light-emitting-element driving ICs 13 of the related light-emitting unit are different from the light-emitting-element driving ICs 3 of the light-emitting unit according to this first embodiment.

The light-emitting-element driving IC 13 of the related light-emitting unit of FIG. 4 controls nine channels and performs line scan control in which the line-scanning number is three. In this case, one light-emitting-element driving IC 13 has nine channels, and hence the light-emitting-element driving IC 13 can perform the lighting drive on each color of the LEDs 1R, 1G, and 1B of three(=9/3) LEDs 1 simultaneously. In the example of FIG. 4, one light-emitting-element driving IC 13 simultaneously performs the lighting drive on horizontally aligned three LEDs 1, such as three LEDs 1 in the first column. This is referred to as the multi-channel control.

On the other hand, the line scan control means control in which columns (lines) to be subjected to the lighting control are successively changed along with time passage. In a case where the line-scanning number of the line scan control in one light-emitting-element driving IC 13 is three, the one light-emitting-element driving IC 13 sequentially performs the lighting drive on the columns (lines) in such a manner as performing the lighting drive on the first column, performing the lighting drive on the second column, performing the lighting drive on the third column, performing the lighting drive on the first column . . . , per unit time. In this manner, according to the line scan control, a large number of LEDs 1 can be subjected to lighting drive control by one light-emitting-element driving IC 13 within a fixed period of time.

To sum up the above, in a case where the light-emitting-element driving IC 13 has an n number of channels and the line-scanning number of the light-emitting-element driving IC 13 is represented as m, the number of the LEDs 1 that can be subjected to lighting drive control by the light-emitting-element driving IC 13 is n×m/3. In the light-emitting-element driving IC 13 of the related light-emitting unit, n equals 9 and m equals 3, and hence the number of the LEDs 1 that can be subjected to lighting drive control by one light-emitting-element driving IC 13 is nine(=9×3/3).

Figure 5:
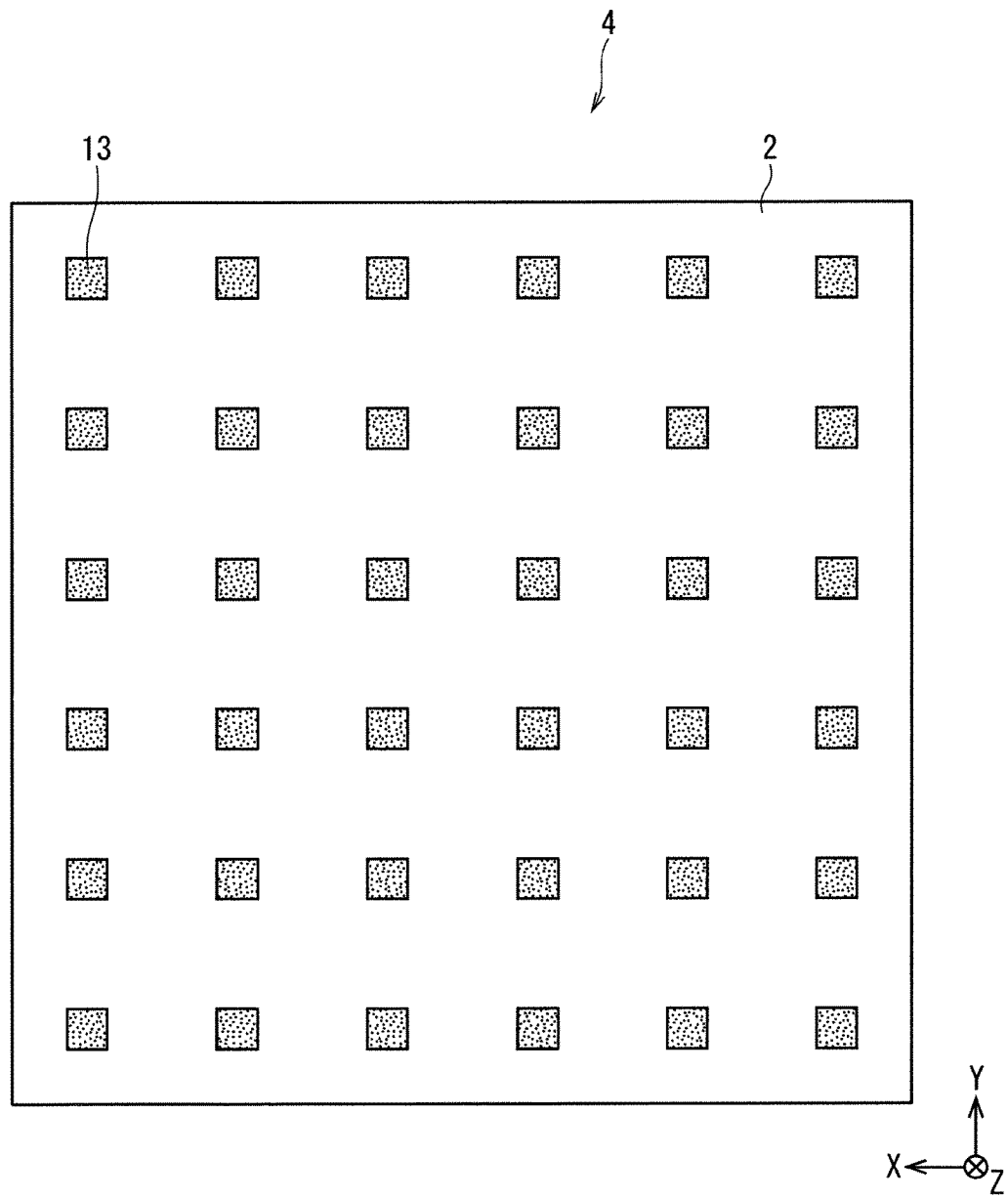
FIG. 5 is a rear view for illustrating a configuration of an LED mounting substrate of a related light-emitting unit.

Next, arrangement of the light-emitting-element driving ICs 13 of the related light-emitting unit is described using FIG. 5. As described above, the number of the LEDs 1 that can be subjected to lighting drive control by one light-emitting-element driving IC 13 of the related light-emitting unit is nine, and hence thirty-six(=324/9) light-emitting-element driving ICs 13 are used in order to perform lighting drive control on three-hundred twenty-four LEDs 1. In the related light-emitting unit of FIG. 5, a total of thirty-six light-emitting-element driving ICs 13 are arranged in the back surface of the substrate 2 in a matrix pattern, six being arranged in the X direction of the substrate 2 and six in the Y direction.

Note that, in the following description, in a case of specifying a position of the light-emitting-element driving IC 13, the light-emitting-element driving IC 13 at an a-th position in the X direction and a b-th position in the Y direction is represented as a light-emitting-element driving ICa•b with reference to the bottom right in FIG. 5. The light-emitting-element driving IC 13 performs lighting drive control on the LEDs 1 in the vicinity thereof. For example, a light-emitting-element driving IC1•1 performs lighting drive control on nine LEDs 1 of an LED1•1, an LED2•1, an LED3•1, an LED2•1, an LED2•2, an LED2•3, an LED3•1, an LED3•2, and an LED3•3.

Incidentally, in the light-emitting unit, a thermally conductive sheet is in many cases attached on the light-emitting-element driving IC 13 so that heat of the light-emitting-element driving IC 13 being a heat generating component is transmitted to the outside via a casing that exists near the light-emitting-element driving IC 13. When such a light-emitting unit is manufactured, one thermally conductive sheet formed into a vertically elongated rectangular shape is attached to some of the light-emitting-element driving ICs 13 aligned in columns along the Y direction so that the thermally conductive sheet is efficiently attached to the plurality of light-emitting-element driving ICs 13.

Reflecting the above, in the related light-emitting unit of FIG. 5, the light-emitting-element driving ICs 13 are arranged in groups of some of the light-emitting-element driving ICs 13 in columns along the Y direction, and all of the light-emitting-element driving ICs 13 are arranged in the same aligned state.

Here, in the related light-emitting unit, the number of channels that can be driven by one light-emitting-element driving IC 13 is comparatively small (herein nine), and hence comparatively a large number of light-emitting-element driving ICs 13 are densely arranged in the substrate 2. However, the number of the LEDs 1 that can be subjected to lighting drive control simultaneously by one light-emitting-element driving IC 13 is comparatively small (herein nine), and hence the quantity of heat generation of one light-emitting-element driving IC 13 is also comparatively small.

In this manner, in the related light-emitting unit having a comparatively small quantity of heat generation in each light-emitting-element driving IC 13, temperature unevenness inside the substrate 2 is small and luminance unevenness and color unevenness are also less of an issue even when comparatively a large number of light-emitting-element driving ICs 13 are arranged in the same aligned state.

However, in order to realize a light-emitting unit, and a display device and a multi-display device including the light-emitting unit at a lower cost in the future, it is effective to increase the number of the LEDs 1 that can be subjected to lighting drive control by one light-emitting-element driving IC 13 through integration of the light-emitting-element driving ICs 13 to increase the number of channels of the light-emitting-element driving ICs 13. Note that, integrated light-emitting-element driving ICs are already productized.

In view of the above, the light-emitting unit according to this first embodiment includes, instead of the light-emitting-element driving IC 13, the light-emitting-element driving IC 3 having a larger number of channels than the light-emitting-element driving IC 13. Hereinafter, description is made supposing that the light-emitting-element driving IC 3 according to this first embodiment controls eighteen channels and performs line scan control in which the line-scanning number is three. In this case, the number of the LEDs 1 that can be subjected to lighting drive control by one light-emitting-element driving IC 3 is eighteen(=18×3/3).

Figure 6:
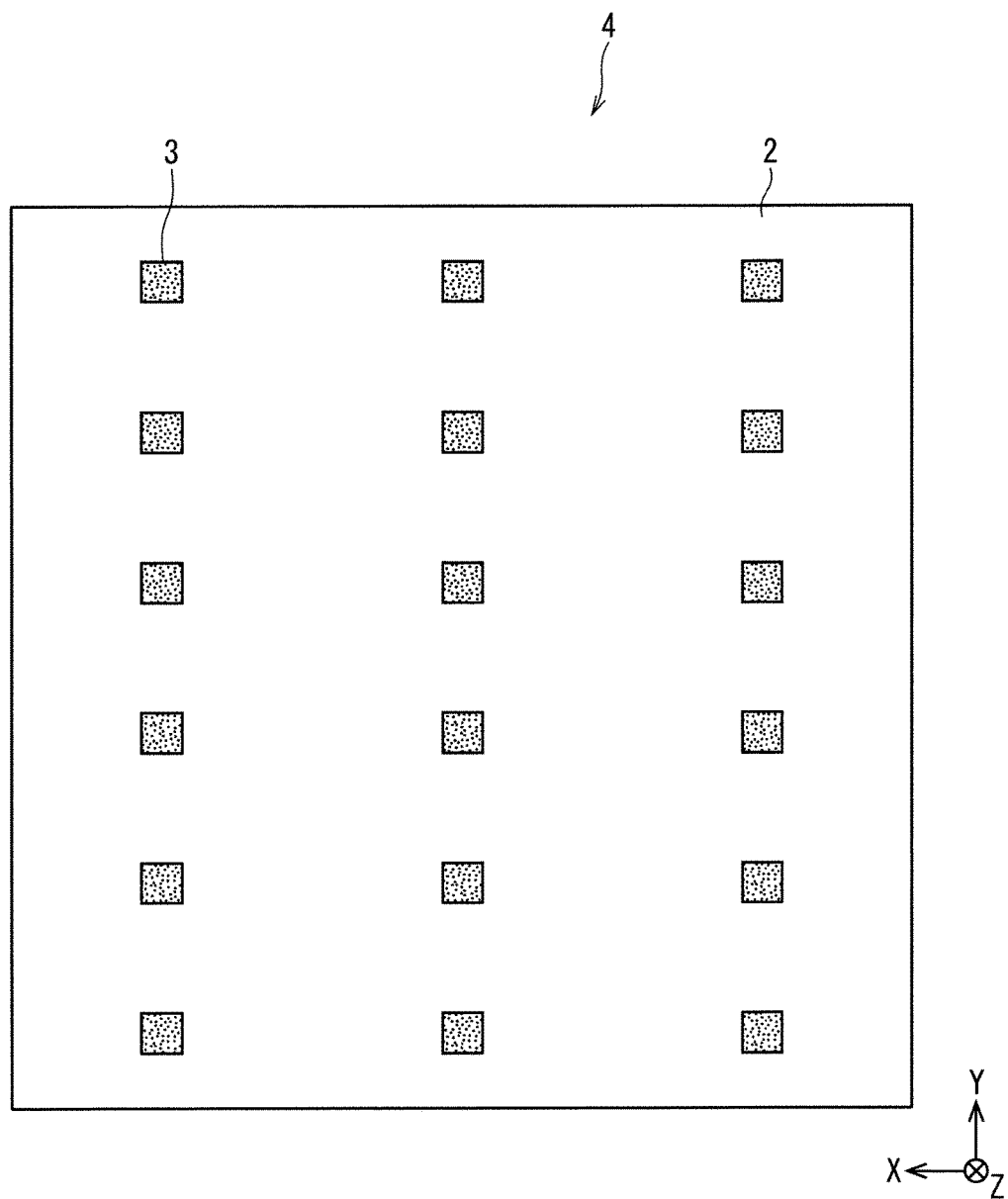
FIG. 6 is a rear view for illustrating a configuration of the LED mounting substrate of another related light-emitting unit.

Next, another related light-emitting unit is described. FIG. 6 is a rear view for illustrating a configuration of another related light-emitting unit. In the related light-emitting unit of FIG. 6, the light-emitting-element driving ICs 3 according to this first embodiment are arranged in the same aligned state similarly to the light-emitting-element driving ICs 13 of the related light-emitting unit of FIG. 5. In order to perform lighting drive control on three-hundred twenty-four LEDs 1 as in FIG. 3, eighteen(=324/18) light-emitting-element driving ICs 3 are used. In the related light-emitting unit of FIG. 6, a total of eighteen light-emitting-element driving ICs 3 are arranged in the back surface of the substrate 2 in a matrix pattern, three being arranged in the X direction of the substrate 2 and six in the Y direction.

The light-emitting-element driving IC 3 having eighteen channels has a doubled quantity of heat generation compared to the light-emitting-element driving IC 13 having nine channels. Further, the light-emitting-element driving ICs 3 in the related light-emitting unit of FIG. 6 are arranged comparatively densely in columns along the Y direction. For this reason, when the plurality of light-emitting-element driving ICs 3 drive the plurality of LEDs 1, temperature of an area in which the plurality of light-emitting-element driving ICs 3 are densely arranged is raised, and temperature of an area in which the plurality of light-emitting-element driving ICs 3 are sparsely arranged is lowered. As a result, as in the hatched region of FIG. 7, temperature unevenness is generated in the back surface of the substrate 2 in a vertical stripe shape along the Y direction. The heat of the back surface of the substrate 2 is also transmitted to the front surface of the substrate 2 due to heat conduction, and thus temperature unevenness similarly in a vertical stripe shape is also generated in a surface of the substrate 2 on the LED 1 side.

Such temperature unevenness causes mainly two kinds of inconvenience. One is luminance unevenness and color unevenness due to difference in temperatures. The other is difference in speed of aging deterioration of luminance due to difference in temperatures.

In theory, the generation of luminance unevenness and color unevenness due to difference in temperatures results from difference in temperature dependency of luminance for each of the LEDs 1R, 1G, and 1B of R, G, and B. In FIG. 8, an example of the temperature dependency of luminance of the LEDs 1R, 1G, and 1B of R, G, and B is illustrated. Note that, in FIG. 8, a solid line, a one-dot chain line, and a long-dashed line represents each temperature dependency of luminance of the LEDs 1R, 1G, and 1B of R, G, and B, respectively.

Provided that R, G, and B have identical drive conditions such as a current value and a duty ratio of PWM, and luminance at the time of 25° C. is defined as 100% as illustrated in FIG. 8. The luminance of R at the time when temperature is 100° C. is lowered by approximately 50%. However, the luminance of each of G and B at the time when temperatures is 100° C. is lowered only by approximately 10%. In this manner, the LEDs 1R, 1G, and 1B of R, G, and B have temperature dependency of luminance. In general, however, the temperature dependency of the luminance of R is high compared to the temperature dependency of the luminance of each of G and B, and the temperature dependency of the luminance of each of G and B is less prominent than the temperature dependency of the luminance of R.

In the related light-emitting unit of FIG. 6, out of the front surface of the substrate 2, temperature of a portion corresponding to the position of the light-emitting-element driving IC 3 is raised, and hence the luminance of R of the LED 1 arranged in the portion is lowered further than the luminance of each of G and B due to the difference in temperature dependency. For this reason, for example, when a white image is displayed in an entire surface, a white color closer to cyan relative to a target white color (white having high color temperature) is adversely displayed in a vertical stripe shape. As a result, the luminance unevenness and color unevenness in a vertical stripe shape are visually recognized by a user adversely, thus generating inconvenience in which the image quality is lowered.

In theory, the generation of difference in speed of aging deterioration of luminance due to difference in temperatures results from temperature dependency of a life of the LED. It is said that the life doubles when the temperature is lowered by 10° C., which is called "Arrhenius theory" and "10° C.-doubling rule" in general. From the above, in a case where the related light-emitting unit of FIG. 6 is used under a state in which temperature unevenness is generated for a long period of time, out of the front surface of the substrate 2, deterioration of the LED 1 arranged at the portion corresponding to the position of the light-emitting-element driving IC 3 advances further than other portions, resulting in adversely darkening only the portion eventually. The luminance unevenness and the color unevenness in a vertical stripe shape are also visually recognized by a user adversely, thus generating inconvenience in which the image quality is lowered.

Figure 9:
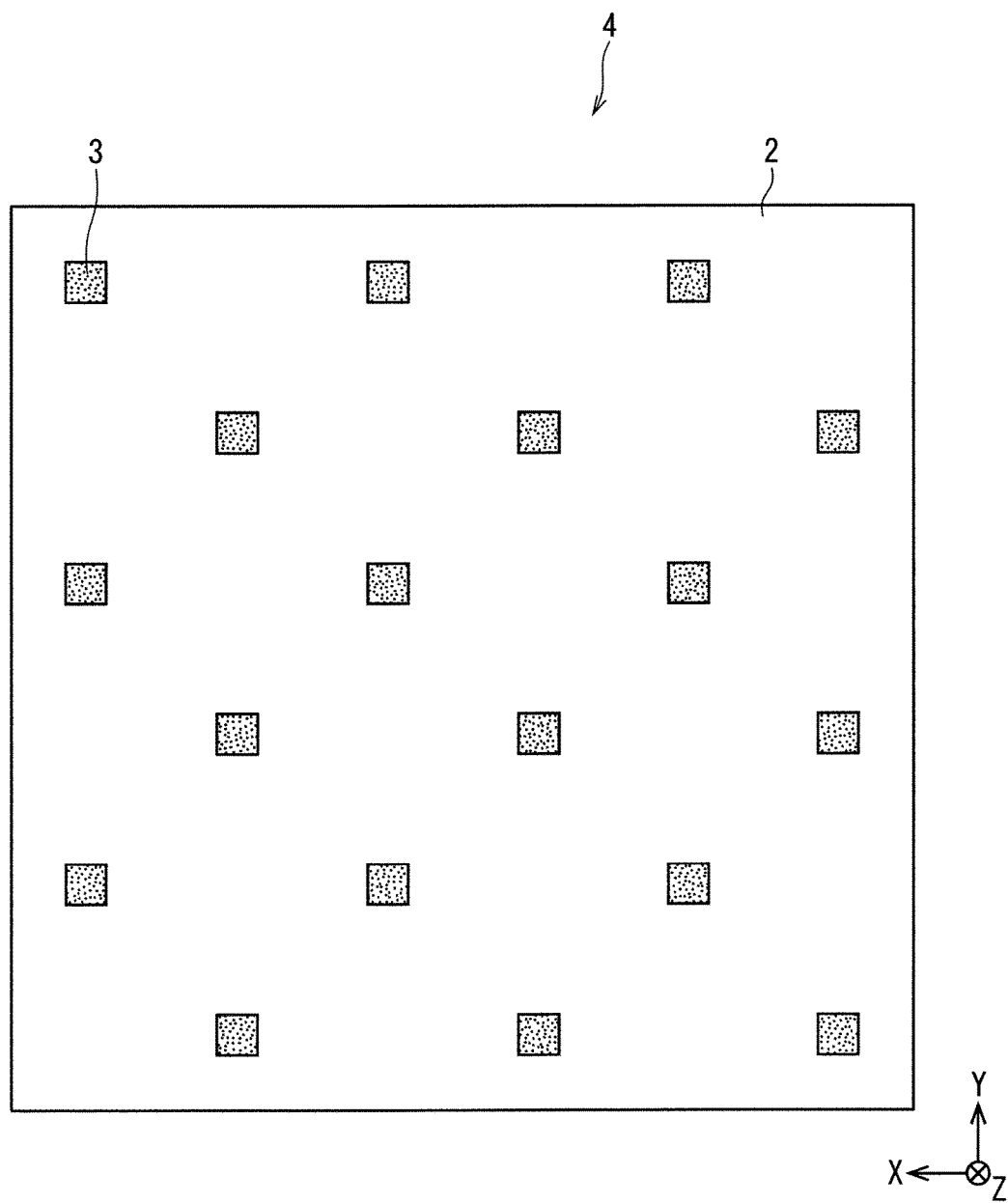
FIG. 9 is a rear view for illustrating a configuration of the LED mounting substrate of the light-emitting unit according to the first embodiment.

Therefore, the light-emitting unit according to this first embodiment to be described next is configured so as to solve such inconvenience and problems. FIG. 9 is a rear view for illustrating a configuration of the LED mounting substrate 4 of the light-emitting unit according to this first embodiment. As is described using FIG. 3, a total of three-hundred twenty-four LEDs 1 are mounted as the LEDs 1, eighteen being mounted in the X direction and eighteen in the Y direction.

Further, the number of channels of the light-emitting-element driving ICs 3 according to this first embodiment is eighteen channels similarly to the related light-emitting unit of FIG. 6, and eighteen light-emitting-element driving ICs 3 are used. For this reason, if the light-emitting-element driving ICs 3 are arranged as in FIG. 6, temperature unevenness is generated. However, this first embodiment features in alignment of the light-emitting-element driving ICs 3 so as to be capable of suppressing the generation of the temperature unevenness.

As the feature thereof, in the configuration of FIG. 9, the plurality of light-emitting-element driving ICs 3 are arranged in the back surface of the substrate 2 in a plurality of aligned states that are different from one another. As an example thereof, the plurality of aligned states herein include a first aligned state and a second aligned state that are different from each other. The plurality of light-emitting-element driving ICs 3 are arranged so that intervals between some of the light-emitting-element driving ICs 3 in the first aligned state in the Y direction and intervals between some of the light-emitting-element driving ICs 3 in the second aligned state in the Y direction are identical but positions of the light-emitting-element driving ICs 3 in the first aligned state in the Y direction and positions of the light-emitting-element driving ICs 3 in the second aligned state in the Y direction are different from each other. Further, as an example thereof, the plurality of light-emitting-element driving ICs 3 are arranged in the back surface of the matrix of the LEDs 1 in a zigzag pattern along the row direction or the column direction.

Figure 7:
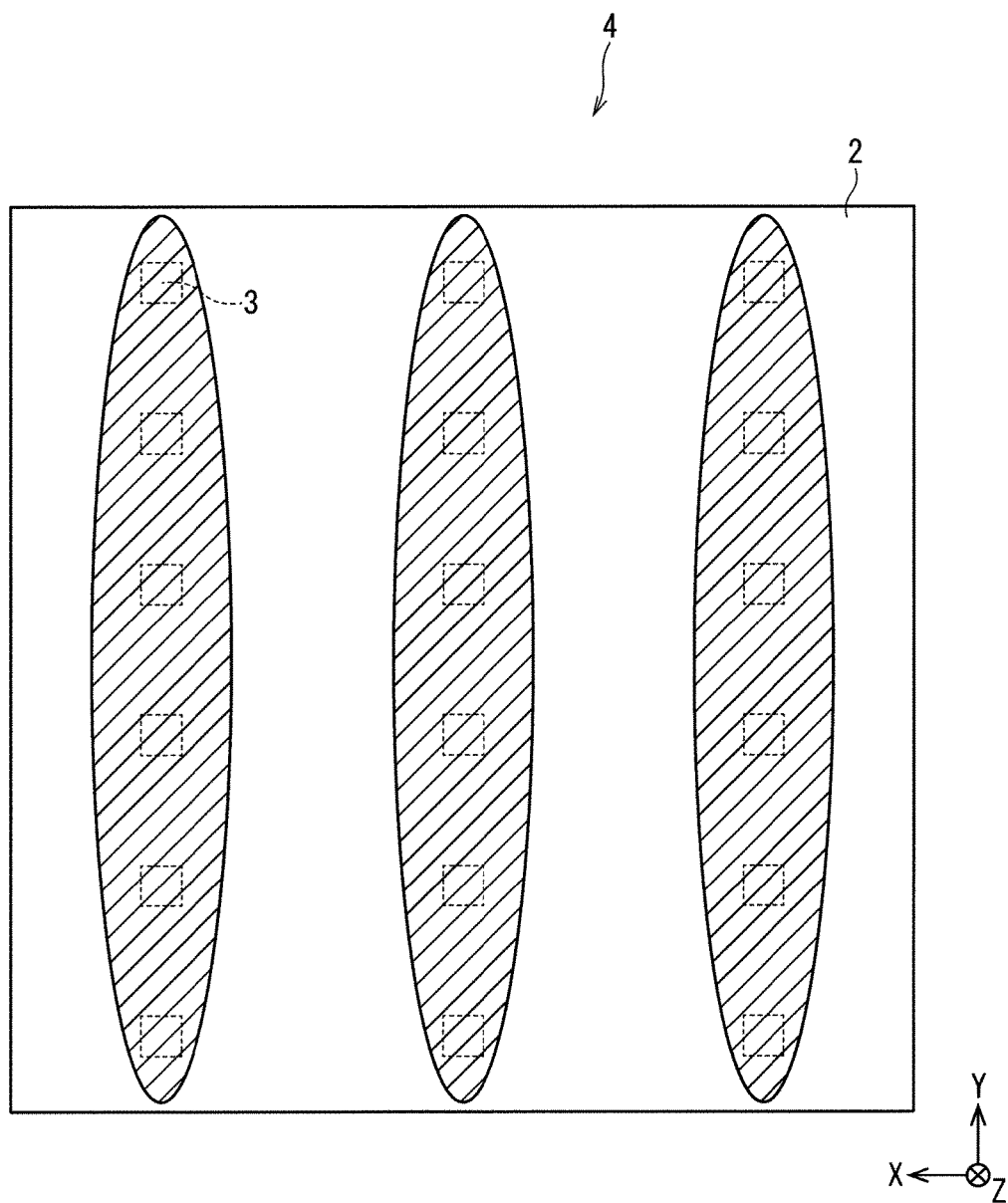
FIG. 7 is a view for illustrating temperature distribution in the another related light-emitting unit.
Figure 10:
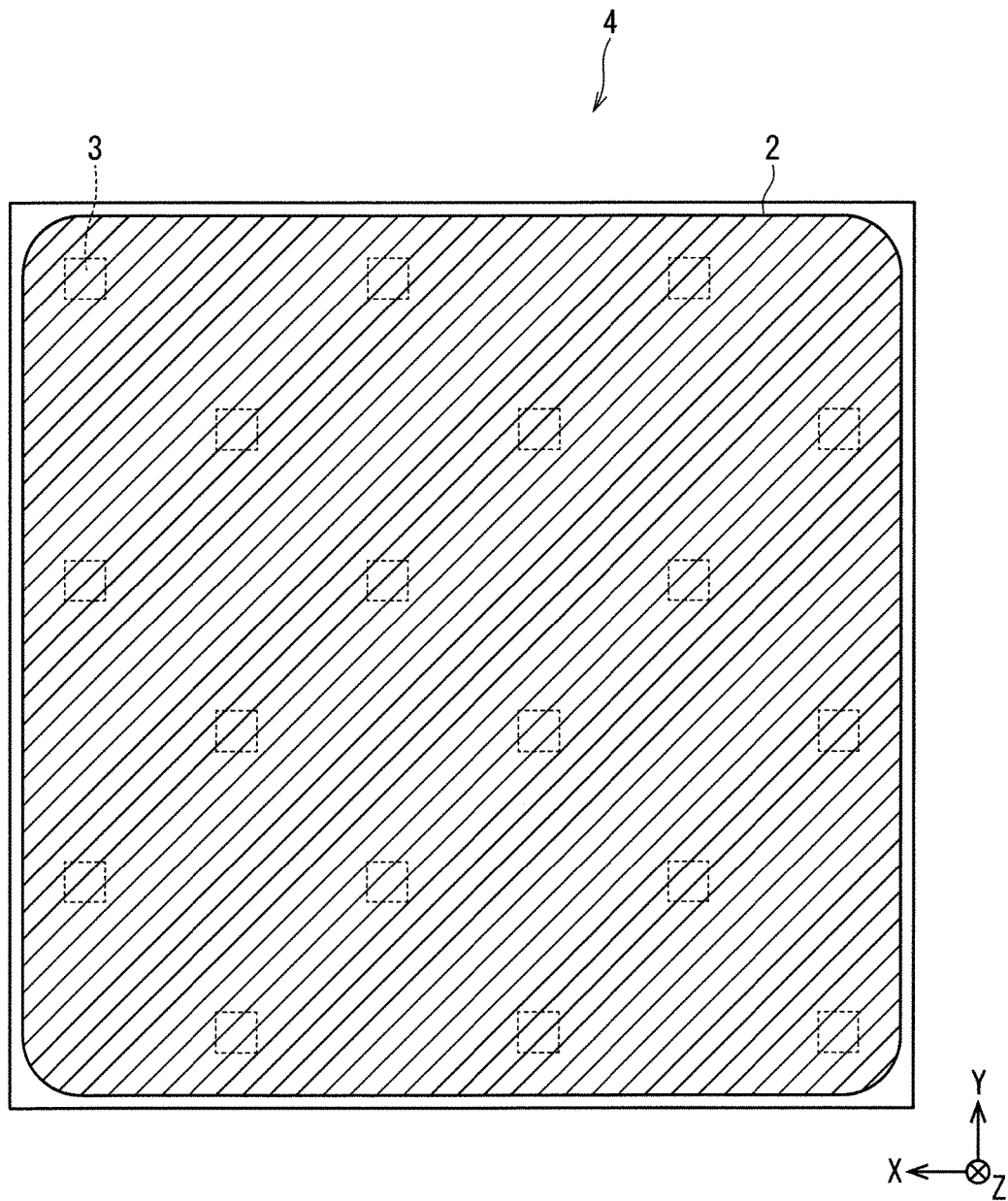
FIG. 10 is a view for illustrating temperature distribution in the light-emitting unit according to the first embodiment.

The plurality of light-emitting-element driving ICs 3 are arranged in a zigzag pattern as described above, thereby improving temperature unevenness in a vertical stripe shape as in FIG. 7 and other temperature unevenness. As a result, as in the hatched region of FIG. 10, temperature distribution of the back surface of the substrate 2, and further, temperature distribution of the front surface of the substrate 2, are made uniform when the plurality of LEDs 1 are driven.

Gist of First Embodiment

In the light-emitting unit according to this first embodiment as described above, the plurality of light-emitting-element driving ICs 3 are arranged in the back surface of the substrate 2 in the plurality of aligned states that are different from each other. For this reason, temperature distribution of the front surface of the substrate 2 is made uniform when the plurality of light-emitting-element driving ICs 3 drive the plurality of LEDs 1. With this, even when a mixed color such as white is displayed, an image of a good image quality that retains uniformity of luminance and chromaticity can be obtained.

Further, temperature unevenness is suppressed even when integrated light-emitting-element driving ICs 3 are used. Accordingly, an image of a good image quality that retains uniformity of luminance and chromaticity can be obtained, and hence a low-cost light-emitting unit in which the number of use of the light-emitting-element driving ICs 3 is reduced can be provided. Further, temperature unevenness is suppressed, and hence the difference in speed of aging deterioration in luminance of the LEDs 1 can be suppressed. As a result, a light-emitting unit capable of retaining an image quality for a long period of time can be provided. Further, temperature distribution is made uniform to thereby be capable of suppressing generation of locally high-temperature portions inside the substrate 2, and hence temperatures of the LEDs 1 and the light-emitting-element driving ICs 3 are lowered relatively. As a result, the LEDs 1 and the light-emitting-element driving ICs 3 can be expected to have high reliability and a long life.

First Modified Example

Figure 11:
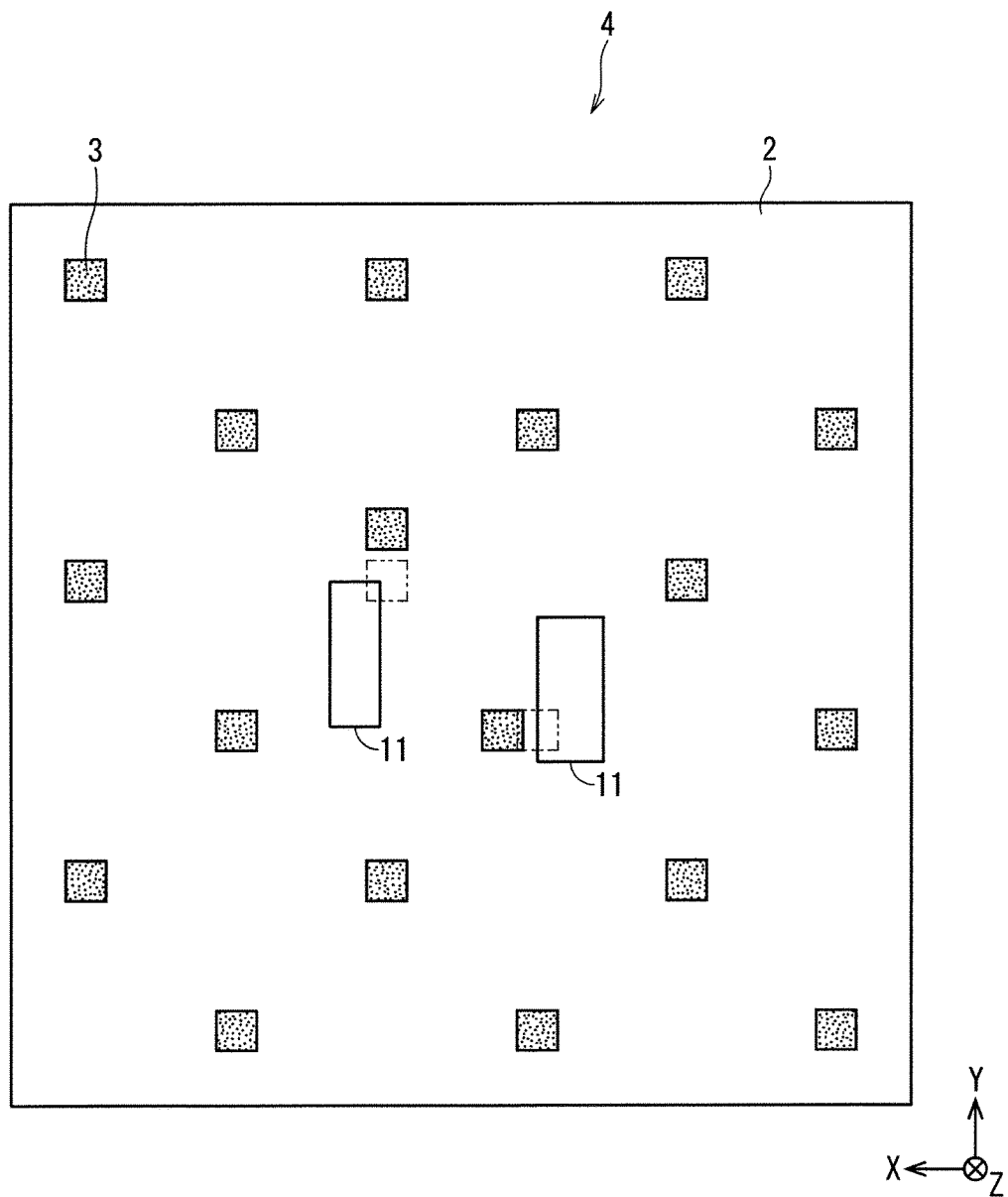
FIG. 11 is a rear view for illustrating a configuration of the LED mounting substrate of the light-emitting unit according to a first modified example.

In actuality, electrical components and connectors other than the light-emitting-element driving ICs 3 are arranged in the back surface of the substrate 2, and due to such limitation, the plurality of light-emitting-element driving ICs 3 cannot be arranged in an ideal zigzag pattern. In this case, as illustrated in FIG. 11, some light-emitting-element driving ICs 3 may be arranged by being slightly moved from the arrangement positions in the ideal zigzag pattern of FIG. 9 (positions of two-dot chain lines) so that the plurality of light-emitting-element driving ICs 3 do not interfere with components such as connectors 11. That is, the above-mentioned zigzag pattern may include a substantial zigzag pattern. Even in this case, the effects described in the first embodiment can be obtained to a certain extent.

Figure 12:
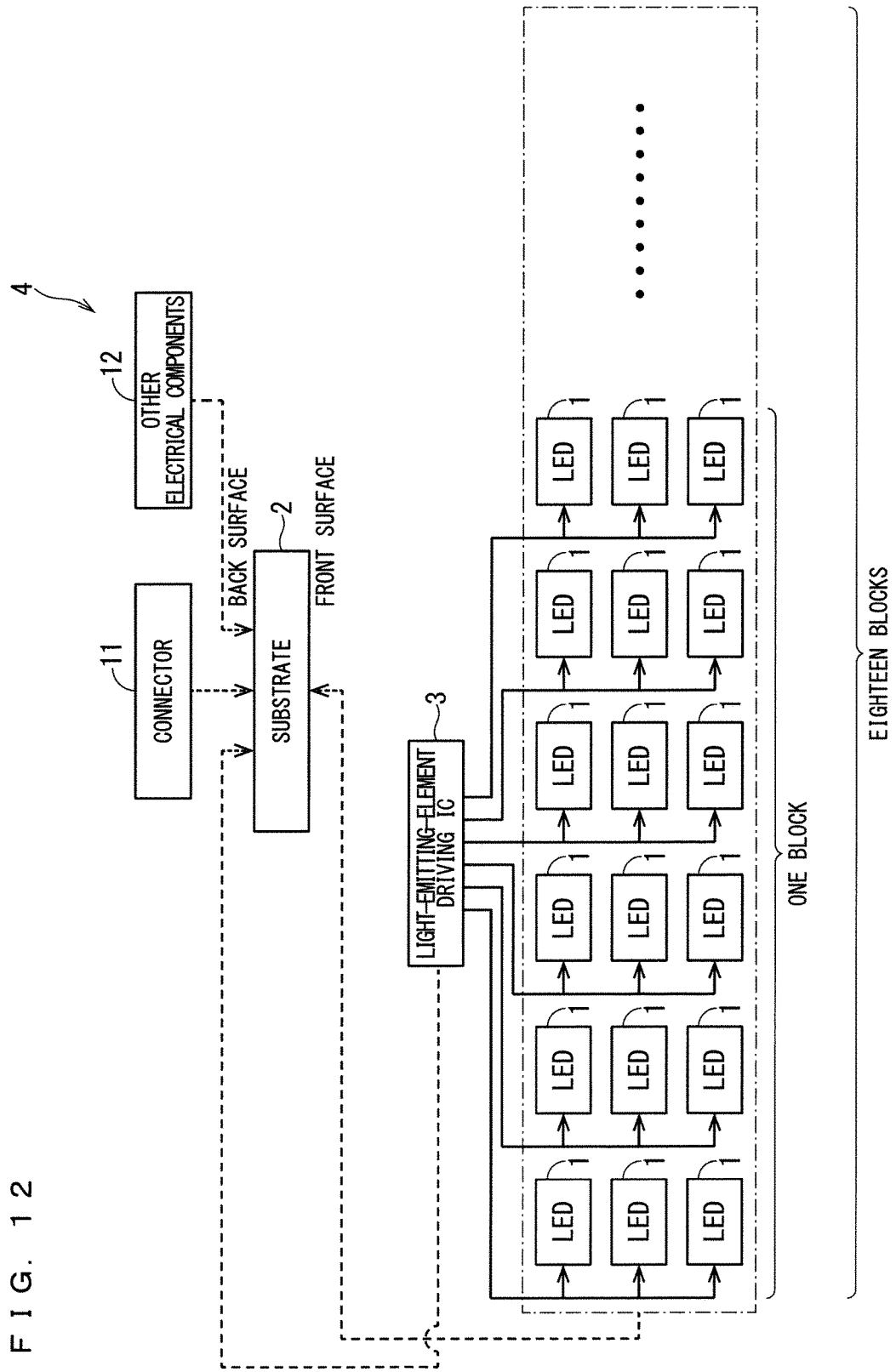
FIG. 12 is a block diagram for illustrating the configuration of the LED mounting substrate of the light-emitting unit according to the first modified example.

In FIG. 12, a block diagram of the LED mounting substrate 4 in this case is illustrated. In FIG. 12, solid arrows indicate electrical connection, and dashed arrows indicate mechanical connection. This holds the same also in the subsequent block diagrams. Note that, in FIG. 12, illustration of electrical connection between the light-emitting-element driving ICs 3 and each of the connectors 11 and other electrical components 12 is omitted.

Second Modified Example

In a case where a cooling fan is not used for suppressing temperature unevenness and the substrate 2 is disposed along a direction other than the horizontal direction, a flow of air is generated toward an upper side in the vertical direction (forward direction of Y) due to natural convection. In this case, air is warmed as approaching to the upper side in the vertical direction, and thus temperature on the upper side in the vertical direction becomes higher than temperature on a lower side in the vertical direction inside the substrate 2.

Figure 13:
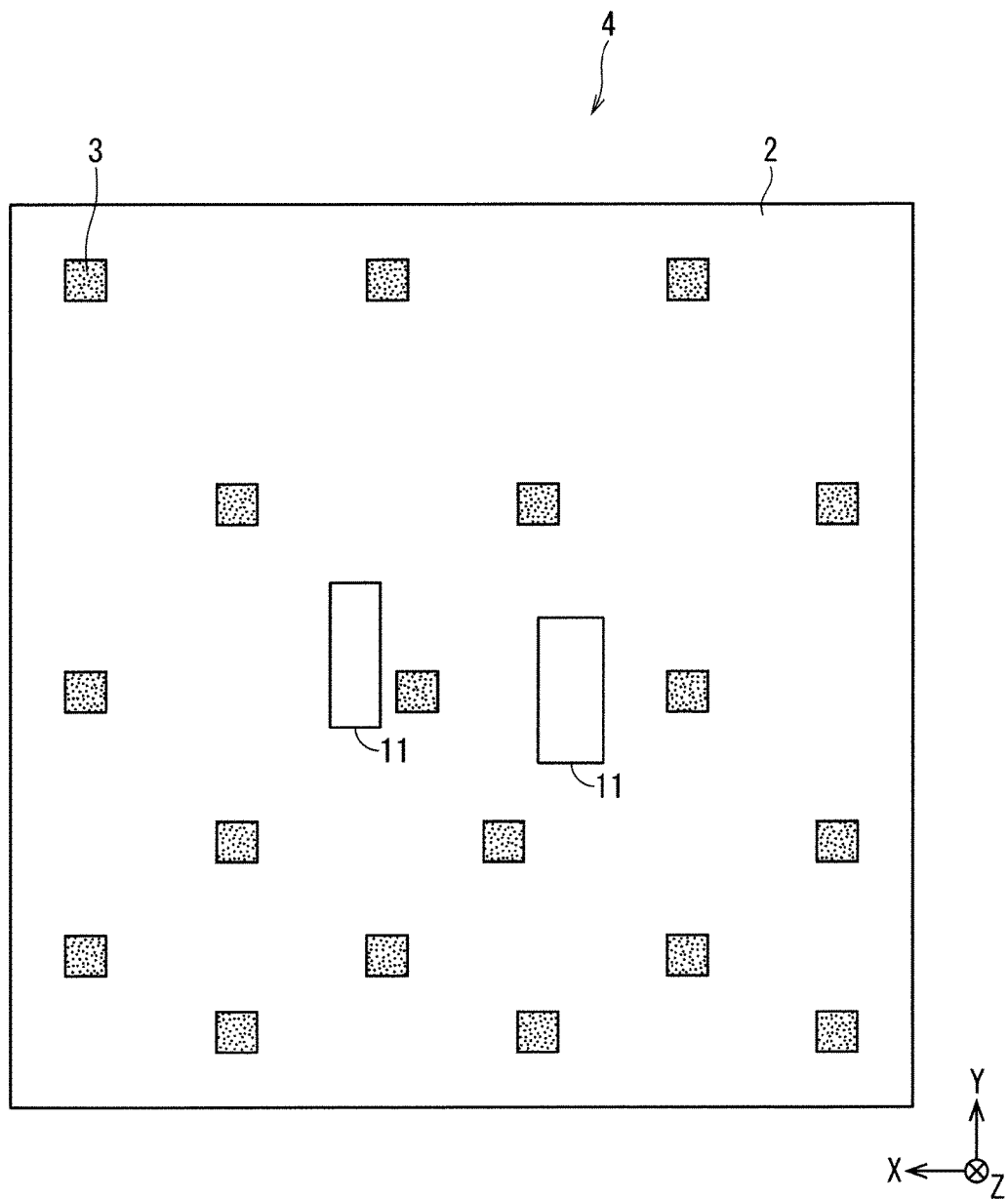
FIG. 13 is a rear view for illustrating a configuration of the LED mounting substrate of the light-emitting unit according to a second modified example.

Therefore, as illustrated in FIG. 13, the plurality of light-emitting-element driving ICs 3 may be arranged, with a slight change in the arrangement of the substantial zigzag pattern, in the back surface of the substrate 2 so as to be more dense toward the lower side from the upper side in the vertical direction with respect to the substrate 2 that is disposed along the direction other than the horizontal direction. According to such a configuration, a larger number of the light-emitting-element driving ICs 3 being heat sources are arranged on the lower side in the vertical direction than on the upper side in the vertical direction, and hence the effects of making the temperature inside the front surface of the substrate 2 uniform can be enhanced.

Third Modified Example

Figure 14:
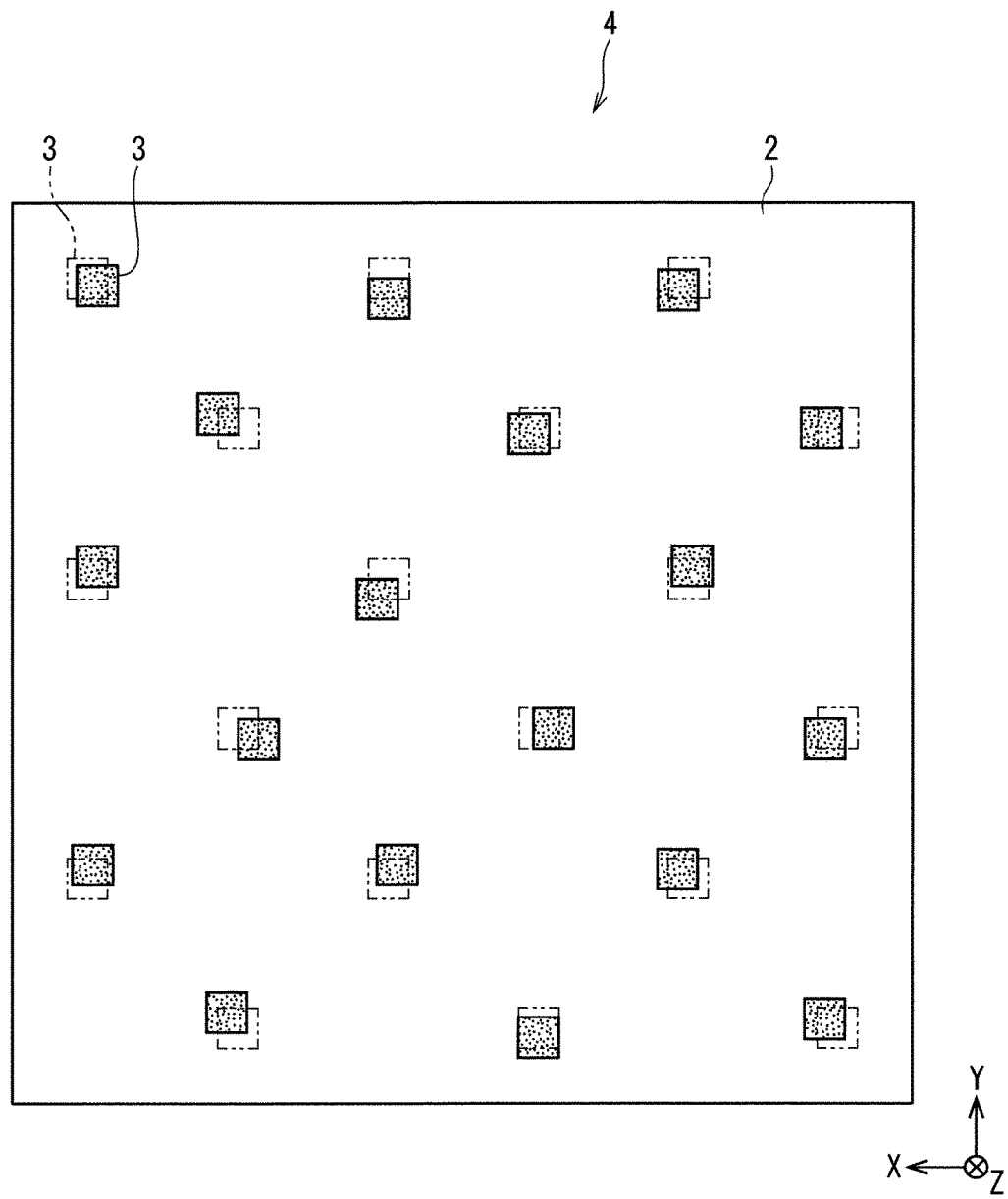
FIG. 14 is a rear view for illustrating a configuration of the LED mounting substrate of the light-emitting unit according to a third modified example.

Note that, in the first embodiment, the plurality of light-emitting-element driving ICs 3 are designed to be arranged in a zigzag pattern. However, the plurality of light-emitting-element driving ICs 3 may not necessarily be arranged in a zigzag pattern, and there is no problem even when other arrangements may be adopted as the arrangement method thereof as long as such an arrangement is adopted that the heat generated by the plurality of light-emitting-element driving ICs 3 is dissipated. For example, the plurality of light-emitting-element driving ICs 3 may be arranged in the back surface of the substrate 2 in an unaligned state. In FIG. 14, as an example of the unaligned state, each of the plurality of light-emitting-element driving ICs 3 may be arranged by being moved in a random direction within a preset distance from the arrangement positions of the ideal zigzag pattern of FIG. 9 (positions of two-dot chain lines). Even in this case, the effects described in the first embodiment can be obtained to a certain extent.

Further, in the above, description is given to a configuration in which four light-emitting-element driving ICs 3 are arranged at four apexes of a square, and one light-emitting-element driving IC 3 is arranged in the center of the square. However, the configuration is not to be limited thereto, and six light-emitting-element driving ICs 3 may be arranged at six apexes of a regular hexagon, and one light-emitting-element driving IC 3 may be arranged in the center of the regular hexagon, for example. Further, the above-mentioned modified examples are also similarly applicable to a second embodiment to be described later.

Second Embodiment

An LED display device being a display device according to a second embodiment of the present invention and a multi-display device according to the second embodiment of the present invention each include the light-emitting unit according to the first embodiment. In the following, out of components to be described in this second embodiment, components that are the same or similar to those in the first embodiment are denoted by the same reference symbols, and different components are mainly described.

Figure 15:
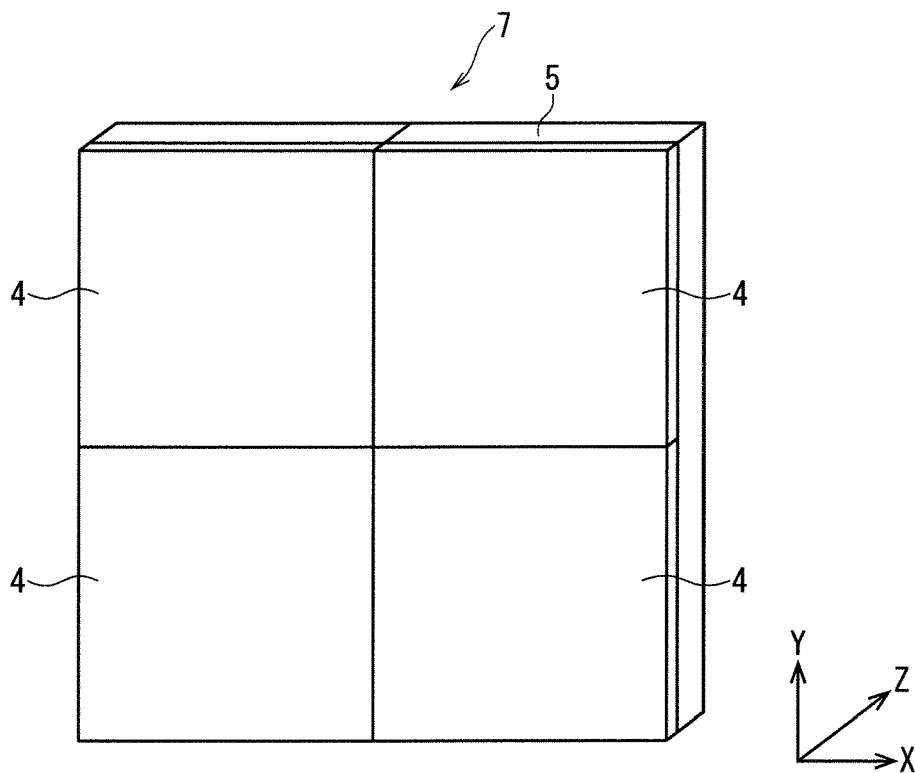
FIG. 15 is a front view for illustrating a configuration of an LED display device according to a second embodiment.
Figure 16:
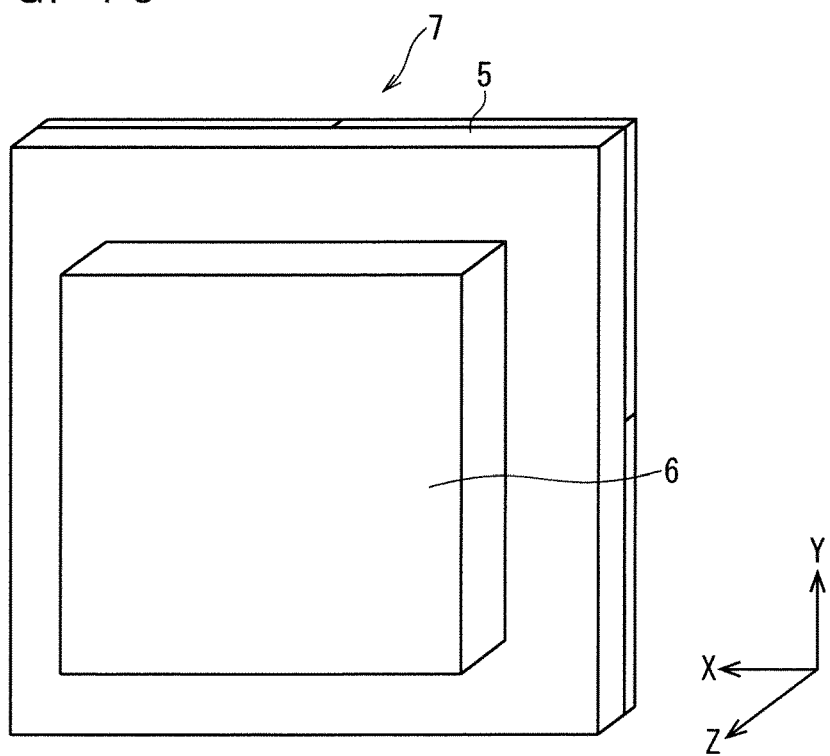
FIG. 16 is a rear view for illustrating the configuration of the LED display device according to the second embodiment.
Figure 17:
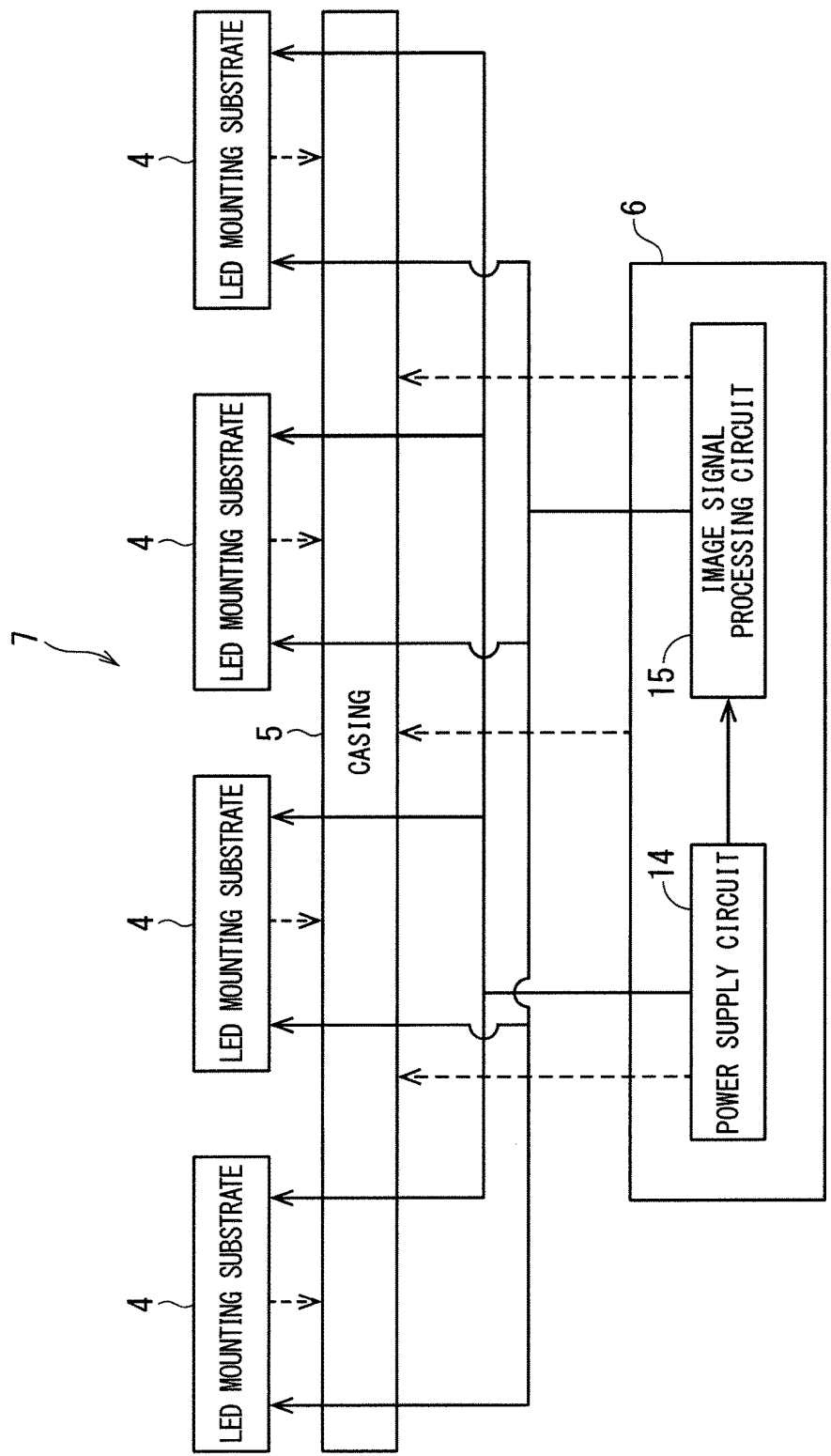
FIG. 17 is a block diagram for illustrating the configuration of the LED display device according to the second embodiment.

FIG. 15, FIG. 16, and FIG. 17 are respectively a front view, a rear view, and a block diagram for illustrating a schematic configuration of an LED display device 7 according to this second embodiment.

Four LED mounting substrates 4 are mounted on a front surface of a casing 5 that is capable of mounting the LED mounting substrates 4. Further, a power supply circuit 14 and an image signal processing circuit 15 that are illustrated in FIG. 17 but not in FIG. 16 and the like are capable of being mounted on a rear surface of the casing 5, which are accommodated by a cover 6.

In this second embodiment, description is given to a mode in which four LED mounting substrates 4, that is, four light-emitting units, are mounted to one casing to form the LED display device, but the mode is not limited thereto. The effects can be similarly obtained even when one or more LED mounting substrates 4, that is, one or more light-emitting units, are used to form the display device, for example.

Figure 18:
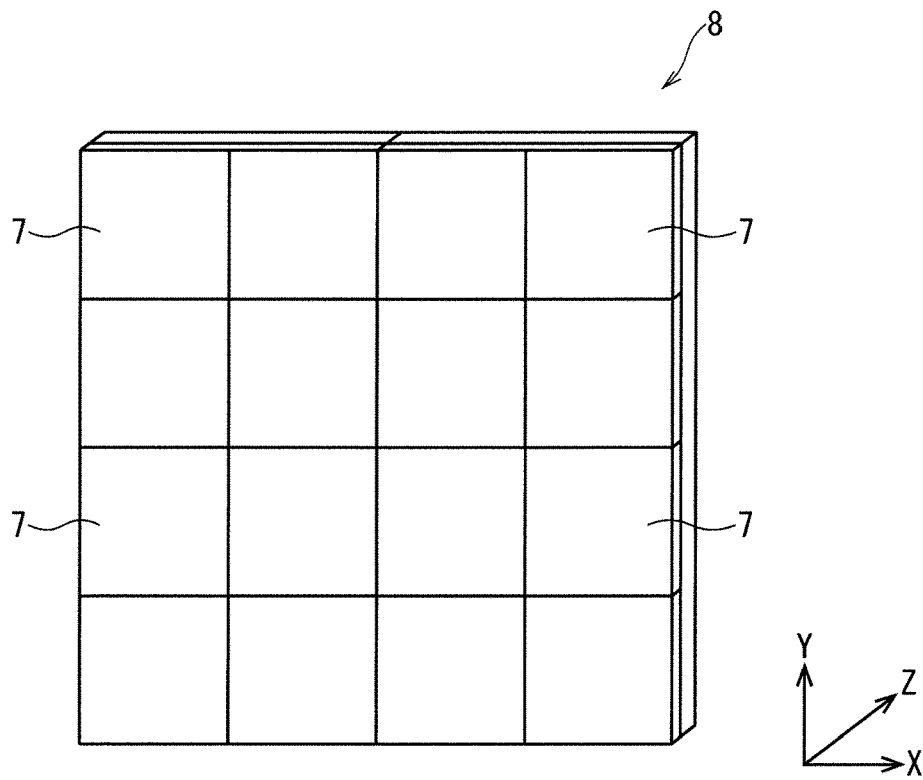
FIG. 18 is a front view for illustrating a configuration of a multi-display device according to the second embodiment.
Figure 19:
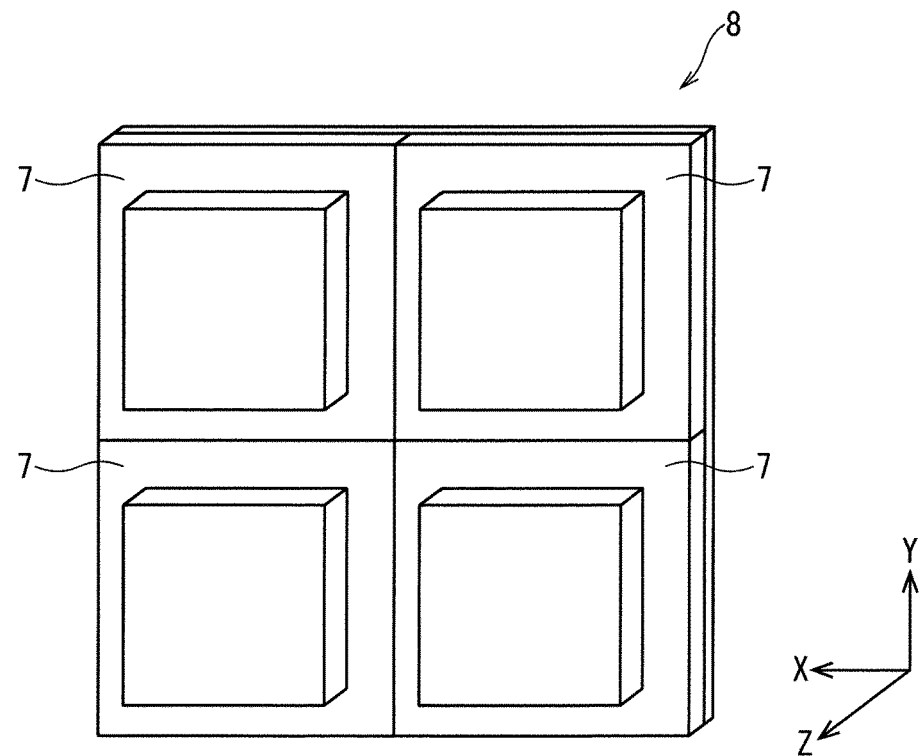
FIG. 19 is a rear view for illustrating the configuration of the multi-display device according to the second embodiment.

FIG. 18, FIG. 19, and FIG. 20 are respectively a front view, a rear view, and a block diagram for illustrating a schematic configuration of a multi-display device 8 according to this second embodiment. In the multi-display device 8, a plurality of the LED display devices 7 are arranged in the X direction, and a plurality of the LED display devices 7 are arranged also in the Y direction, thereby arranging the LED mounting substrates 4, and further, the substrates 2, of the LED display devices 7 in a matrix pattern. With this, a large screen can be formed in which joining parts thereof are less liable to be visually recognized.

Note that, in the examples of FIG. 18 to FIG. 20, a total of four LED display devices 7 are arranged, two being arranged in the X direction and two in the Y direction, thereby forming a large multi-screen. However, the number of the LED display devices 7 is not to be limited thereto as a matter of course. Further, the example of FIG. 20 shows that the plurality of LED display devices 7 are mechanically connected mutually with dashed arrows. However, the plurality of LED display devices 7 may be electrically connected mutually as a matter of course

Gist of Second Embodiment

The LED display device 7 and the multi-display device 8 according to this second embodiment as described above each include the light-emitting unit according to the first embodiment. For this reason, similarly to the first embodiment, even when a mixed color such as white is displayed, an image of a good image quality that retains uniformity of luminance and chromaticity can be obtained.

Further, temperature unevenness can be suppressed even with use of the integrated light-emitting-element driving ICs 3. Accordingly, an image of a good image quality that retains uniformity of luminance and chromaticity can be obtained, thereby being capable of providing a low-cost display device and multi-display device in which the number of uses of the light-emitting-element driving ICs 3 is reduced. Further, temperature unevenness is suppressed, and hence the difference in speed of aging deterioration in luminance of the LEDs 1 can be suppressed. As a result, a display device and a multi-display device capable of retaining an image quality for a long period of time can be provided. Further, temperature distribution is made uniform to thereby be capable of suppressing generation of the locally high-temperature portions inside the substrate 2, and hence temperatures of the LEDs 1 and the light-emitting-element driving ICs 3 are lowered relatively. As a result, the LEDs 1 and the light-emitting-element driving ICs 3 can be expected to have high reliability and a long life.

Further, acquirement of luminance information during an image display and installation of a cooling fan are unnecessary, and hence low-noise and low-cost display device and multi-display device can be provided.

MODIFIED EXAMPLE

In the description above, description is given supposing that the light-emitting element is an LED. However, the light-emitting element is not to be limited thereto, and may be an organic electro-luminescence (EL) light-emitting element or the like, for example. The organic EL light-emitting element also has, similarly to the LED, difference in temperature dependency of luminance depending on colors, and hence the technology described above is effective in a display device including the organic EL light-emitting element.

Note that, in the present invention, each of the preferred embodiments and each of the modified examples may be freely combined, and each of the preferred embodiments and each of the modified examples may be appropriately modified or omitted within the scope of the invention.

The present invention is described in detail. However, the description above is merely an example in any mode, and the present invention is not to be limited thereto. It is understood that a numerous unexemplified modified examples may be assumed without departing from the scope of the present invention.

EXPLANATION OF REFERENCE SIGNS

1 LED, 2 substrate, 3 light-emitting-element driving IC, 7 LED display device, 8 multi-display device.

The invention claimed is:
1. A light-emitting unit comprising:
a substrate having a first surface and a second surface that is on an opposite side to the first surface;
a plurality of light-emitting elements arranged on the first surface; and
a plurality of light-emitting-element driving portions each for driving at least two light-emitting elements included in the plurality of light-emitting elements, wherein
the plurality of light-emitting-element driving portions are arranged on the second surface in an arrayed state including a first aligned state and a second aligned state in which the plurality of light-emitting-element driving portions are arrayed alternately in a row direction and positions of the plurality of light-emitting-element driving portions in a column direction are different from one another, and a part of the plurality of light-emitting-element driving portions are arranged on the second surface in the arrayed state, or the plurality of light-emitting-element driving portions are arranged on the second surface in an arrayed state in which the plurality of light-emitting-element driving portions are moved to a vicinity of each of the positions of the arrayed state.

2. The light-emitting unit according to claim 1, wherein the plurality of light-emitting elements each comprise an LED.

3. The light-emitting unit according to claim 1, wherein the plurality of light-emitting elements each comprise an element having LEDs of red, green, and blue.

4. A display device comprising at least one light-emitting unit of claim 1.

5. A multi-display device comprising a plurality of the display devices of claim 4, wherein the substrate of the plurality of the display devices is arranged in a matrix pattern.

6. A light-emitting unit comprising:

a substrate having a first surface and a second surface that is on an opposite side to the first surface;

a plurality of light-emitting elements arranged on the first surface; and a plurality of light-emitting-element driving portions each for driving at least two light-emitting elements included in the plurality of light-emitting elements, wherein:

the plurality of light-emitting-element driving portions are arranged on the second surface in a plurality of aligned states that are different from one another, or arranged on the second surface in an unaligned state;

the substrate is disposed along a direction other than a horizontal direction; and the plurality of light-emitting-element driving portions are arranged on the second surface so as to be more dense toward a lower side from an upper side in a vertical direction with respect to the substrate that is disposed along the direction other than the horizontal direction.

* * * * *